United States Patent [19]
Gorowitz et al.

[11] Patent Number: 5,857,858
[45] Date of Patent: Jan. 12, 1999

[54] DEMOUNTABLE AND REPAIRABLE LOW PITCH INTERCONNECT FOR STACKED MULTICHIP MODULES

[75] Inventors: Bernard Gorowitz, Clifton Park; Robert John Wojnarowski, Ballston Lake, both of N.Y.; Ronald Frank Kolc, Cherry Hill, N.J.

[73] Assignee: General Electric Company, Schenectady, N.Y.

[21] Appl. No.: 773,625

[22] Filed: Dec. 23, 1996

[51] Int. Cl.⁶ .................................................. H05K 1/11
[52] U.S. Cl. ............................ 439/86; 361/729; 257/686
[58] Field of Search ............................... 439/69, 74, 75; 361/729, 735, 740, 790, 744, 86, 87, 88, 89, 91; 257/686

[56] References Cited

U.S. PATENT DOCUMENTS

| | | | |
|---|---|---|---|
| 2,774,014 | 12/1956 | Henry, Jr. ................................. | 361/729 |
| 3,243,661 | 3/1966 | Ullery, Jr. ................................ | 361/729 |
| 3,761,858 | 9/1973 | Oka ........................................ | 361/729 |
| 4,783,695 | 11/1988 | Eichelberger et al. . | |
| 5,019,946 | 5/1991 | Eichelberger et al. ................. | 361/795 |
| 5,107,586 | 4/1992 | Eichelberger et al. .................... | 29/830 |
| 5,353,195 | 10/1994 | Fillion et al. ........................... | 361/760 |
| 5,353,498 | 10/1994 | Fillion et al. ............................. | 29/840 |
| 5,514,907 | 5/1996 | Moshayedi .............................. | 257/686 |
| 5,664,953 | 9/1997 | Reylek ..................................... | 439/86 |

OTHER PUBLICATIONS

"Assembly with Conductive Adhesives" by K. Gilleo, Proceedings of Surface Mount International 1994, San Jose, CA, pp. 279–288.

*Primary Examiner*—Neil Abrams
*Attorney, Agent, or Firm*—Ann M. Agosti; Marvin Snyder

[57] ABSTRACT

Connection elements which, for example, may be used to facilitate interconnection to and stacking of electronic assemblies or may include an elongated conductive core, such as a wire or a hollow tube structure, coated with a layer of elastomeric material containing conductive particle such that the elastomeric material is conductive at least when compressed. The substrates of multi-chip modules (MCMs) have electrical connection sites in the form of metal-lined channels in the substrate edges, and the connection elements are pressed into the channels. Separate compression or clamping elements may be employed to enhance conductivity, as well as to facilitate external connections. The elongated conductive core may take the form of a hollow tube structure which may be expanded under internal pressure to compress the layer of elastomeric material. The compression elements may take the form of printed circuit boards. In alternative embodiments the connection elements may be clamped between conductive channels of side-by-side substrates or between opposed conductive channels of stacked substrates.

25 Claims, 11 Drawing Sheets

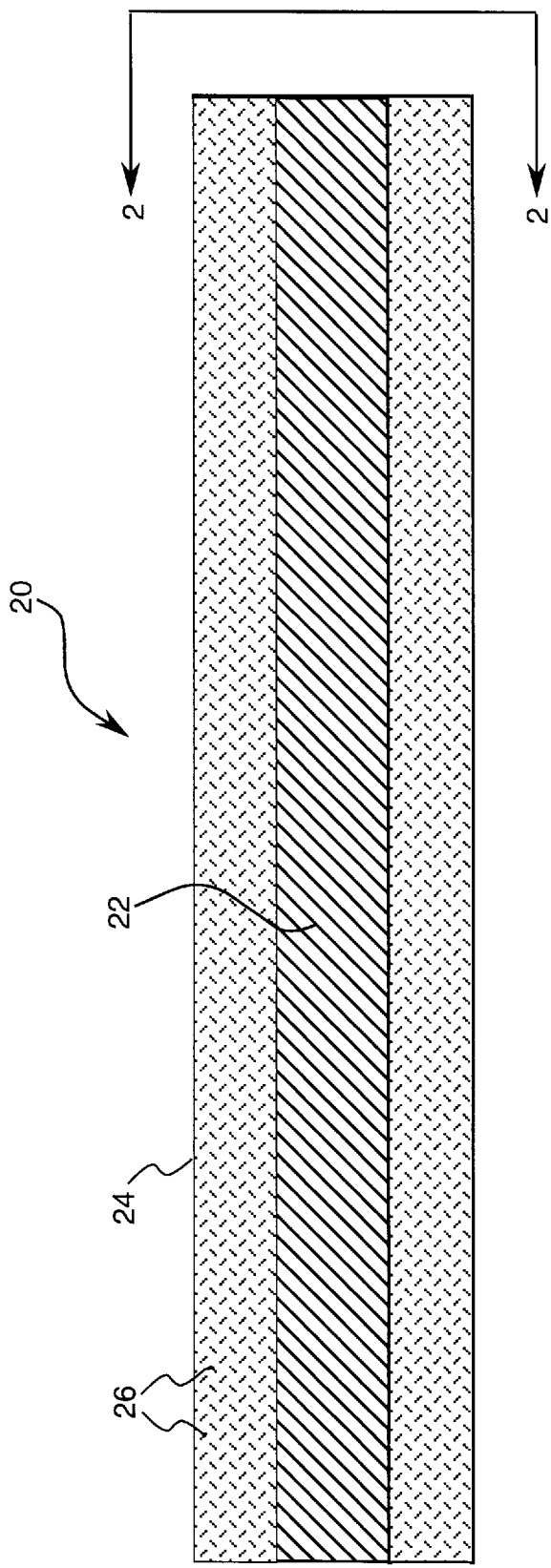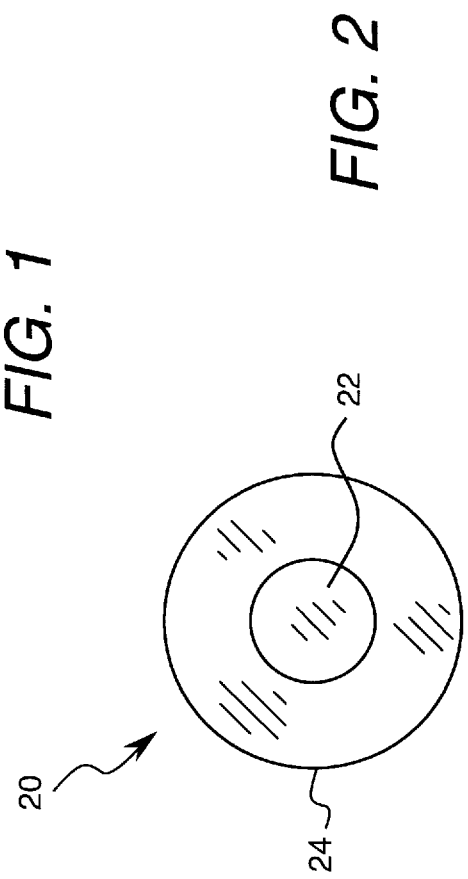

DEMOUNTABLE AND REPAIRABLE LOW PITCH INTERCONNECT FOR STACKED MULTICHIP MODULES

BACKGROUND OF THE INVENTION

This invention relates generally to electrical interconnections between electronic modules and, more particularly, to stacked circuit substrates or modules, such as multi-chip modules (MCMs), having closely spaced interconnections that can be readily removed for repair, replacement and reconfiguration of individual modules.

The invention is applicable in particular to memory modules and electronic back planes, where the interconnect structure is not very complex, and the substrates or modules have a high degree of common signals or electrical potentials. The invention is also applicable to demountable and repairable assemblies of supercomputer modules.

Disclosed in Eichelberger et al U.S. Pat. No. 4,783,695 and related patents, a high density interconnect (HDI) structure offers many advantages in the compact assembly of electronic systems which include a number of integrated circuit "chips." HDI fabrication techniques can be employed to form multi-chip modules (MCMs). Very briefly, a substrate is provided. The substrate is typically made of ceramic. However, plastics or composites of various types may also be employed. Individual cavities or one large cavity having appropriate depths at the intended locations of the various chips are prepared. The various "chips" and other components are placed in their desired locations within the cavities, and adhered by means of a thermoplastic adhesive layer. A multiple layer interconnect overcoat structure is then built up to electrically interconnect the components into a functioning system.

The process of forming the multiple layer interconnect overcoat structure begins with laminating a polyimide dielectric film, which may be DuPont Kapton, polyimide, about 12.5 to 75 microns thick, across the top of the chips, other components and the substrate. The as-placed locations of the various components and contact pads thereon are then determined, and via holes are laser drilled in the Kapton film in alignment with the contact pads. A metallization layer is deposited over the Kapton film layer and extends into the via holes to make electrical contacts to the contact pads disposed thereunder. This metallization layer may be patterned to form individual conductors during the process of depositing it, or may be deposited as a continuous layer and then patterned using photoresist and etching. Additional dielectric and metallization layers are formed as required to make all of the desired electrical connection among the chips supported by the substrates.

For even higher density, individual HDI substrates or modules have been stacked to form what may be termed a three-dimensional high density interconnect structure. Examples are disclosed in Eichelberger et al U.S. Pat. Nos. 5,019,946 and 5,107,586. The individual HDI modules are vertically interconnected by providing electrical contact pads on the side surfaces of the individual HDI substrates, so that, when the individual substrates are stacked, the stacked configuration has a side surface presenting a number of contact pads which can then be interconnected to form interconnections between the substrates.

To make interconnections on the side surface, a fabrication process comparable to the above-summarized lamination process for building the multi-layer interconnection overcoat structure of the individual modules is employed, including laser ablating vias down to the edge pads, metallizing and patterning the metal.

This process is both time consuming and costly. The resultant assembly is essentially a bonded stack that is not easily repairable or demountable for replacement of defective modules.

As an alternative, wire bonding of the edge pads of such stacked modules has been performed. However, wire bonding increases interconnect length and the wire bonds are difficult to remove without damage to the modules. In addition, the process requires specialized wire bonding equipment which can operate on the edges of the substrates.

To avoid wire bonding to the substrate edges, pyramidal structures may be formed with a succession of module sizes, so that one tier of interconnects can be wire bonded from the upper major surface of one module to interconnect pads on the upper major surfaces of the adjacent tier or tiers. Such a pyramidal structure imposes a penalty in that the area of the upper modules in the stack must be reduced.

Another solution that has been proposed is the use of anisotropic conductive adhesive films. As is described for example in a literature reference Gilleo, K. (Alpha Metals, Jersey City, N.J.), "Assembly with Conductive Adhesives," Proceedings of Surface Mount International 1994, San Jose, Calif., pp. 279–288, anisotropic conductive adhesives provide unidirectional conductivity in the direction of the vertical, or Z-axis. This uni-directional conductivity is achieved by using a relatively low volume loading of conductive filler in a dielectric polymer bonding agent. The low volume loading is insufficient for inter-particle contact and prevents conductivity in the X-Y plane of the adhesive. The material, in film or paste form, is interposed between the surfaces to be connected. Application of heat and pressure causes conductive particles to be trapped between opposing conductor surfaces. Once electrical continuity is produced, the dielectric polymer binder is hardened by thermally initiated chemical reaction (thermosets) or by cooling (thermoplastics). The hardened polymer holds the assembly together and helps maintain the pressure contact between conductors and particles.

For assembling a three-dimensional stack of modules, anisotropic conductive adhesive films are placed between adjacent modules to establish electrical connections between pads on the bottom of one module and on the top of the next lower module in a stack. For the bottom connection, within or on the individual module substrate, interconnects are extended bottom pads through via holes or wrap around interconnects. As in the case of the three-dimensional high density interconnect structure summarized above, the resultant assembly is essentially a bonded stack that is not easily repairable or demountable for replacement of defective modules.

Soldered interconnects such as ball grid arrays (BGA) offer similar possibilities. Ball grid arrays also have the disadvantages of relative difficulty in assembly and repair, as well as a lack of demountability. Further, it is difficult to achieve a high density of interconnect even with micro-ball grid arrays. A 50 mil pitch is typical, with perhaps a 10 mil pitch being the lower limit which can be achieved with a ball grid array.

Also relevant in the context of the present invention is the prior art use of conductive elastomeric materials for providing electrical interconnection. Conductive elastomeric materials typically employ conductive particles, such as silver, carbon, nickel and gold, dispersed throughout a rubber-like material, such as silicone rubber material or certain polyurethanes.

Like anisotropic conductive adhesives, conductive elastomeric materials are typically anisotropic, meaning they are conductive, when compressed, only in the direction of compression, compression causing the conductive particles to contact each other. Generally, raised contact pad areas are provided, designed to give a 20% compression, or better. Sheets of anisotropic conductive elastomeric materials accordingly can be employed to achieve selective connection zones, while maintaining virtual open circuits to adjacent lines or pads.

Such conductive elastomeric materials (as well as anisotropic conductive adhesives) have been used for years to interconnect liquid crystal display cells and printed circuit boards to other electronics. In the case of connections to liquid crystal display cells, high resistance connections (e.g. hundreds of Ohms) are acceptable, since such constitutes a small additional series resistance. Carbon fillers in silicone rubber have been used for these applications for years. In other applications where a lower resistance interconnect is required, silver or gold fillers are used in the elastomeric interconnect materials.

A disadvantage of such use of sheets of anisotropic conductive elastomeric material deserving mention in the context of the present invention is that they can take a compressive "set," and often are not reusable following a repair operation.

To eliminate multiple particle connection regions that are intrinsic to the use of elastomeric materials filled with conductive particles, a structure known as metal ring banding can be employed. In metal ring banding, a plurality of conductive rings are provided around an elongated silicone core. The metal rings do not touch, and so maintain electrical isolation. When compressed, selected areas are connected. Metal ring banding around a silicone core is limited in the thickness of the core material, which is generally in the 15–20 mil region and up.

Another interconnection technique which deserves brief mention in the context of the subject invention is the use of the Zebra strip connectors, where wires are arrayed in a vertical orientation between PC boards and the like. These wires are on a 50 mil or greater pitch. The connections are made by pressure and are not widely used, due to the large containment structures employed to keep from bulging. Zebra strip connectors are generally used to make connections from one MCM to another, but without making connections to the edges of the MCMs. Zebra strip connections are not well suited to stacking modules, unless a backplane is provided.

SUMMARY OF THE INVENTION

It is an object of the invention to provide removable electrical interconnections between electronic modules.

It is another object of the invention to provide interconnections with a relatively low pitch, for example, connections that are 2 mils wide with a 2 mil spacing.

It is another object of the invention to provide connections which have a constant relatively low impedance, in the million range, and which can be employed MCM-to-MCM in a three dimensional structure.

In accordance with one aspect, the invention provides connection elements which have an elongated electrically conductive core coated with a layer of elastomeric material containing conductive particles.

An electrically insulating circuit substrate having a pair of opposed major surfaces and a side surface, such as an HDI substrate or multi-chip module (MCM) as summarized hereinabove, has electrical connection sites formed in the side surface, and thus serves as an interconnect support for the connection sites. The electrical connection sites are channels formed in the side surface and lined with an electrically conductive layer electrically connected to circuitry supported by the substrates. Such "circuitry" can include integrated circuit "chip," as well as micro electromechanical structures (MEMS), including piezoelectric devices.

The connection element is placed within the channel and compressed as required, either by the channel itself or by a separate compression or clamping element.

This forms a low constant impedance electrical connection. In general the particle-containing elastomeric material becomes conductive when compressed. However, the elastomeric material layer may be filled with conductive particles to the point where the elastomeric material layer is conductive in an uncompressed state.

The compression element may take the form of a suitably-backed printed circuit board supporting a conductor pressed against the connection element, a printed circuit board including an electrically conductive via hole pressed against the connection element, or another electrically insulating circuit substrate. The connection element of the invention may be employed to form interconnects in both two-dimensional and three-dimensional structures.

For increased localized compression of the layer of elastomeric material, a radially-extending electrically conductive structure may be provided on the core.

In another aspect, the invention provides a stack of interconnected electronic modules, forming a three-dimensional high density interconnect structure. A plurality of electrically insulating substrates are arranged in a stacked configuration, each substrate having a pair of opposed major surfaces and a side surface, and each of the substrates supporting circuitry such as integrated circuit "chips," or micro electromechanical structures (MEMS), including piezoelectric devices. Electrical connection sites are provided on side surfaces of the substrates and arranged as aligned electrically connection sites on at least one side of the stacked configuration. The electrical connection sites take the form of channels formed in the respective side surface of the particular substrate, extending between the opposed major surfaces. The channels are lined with electrically conductive layers electrically connected to the circuitry supported by each of the substrates.

The connection elements are pressed or otherwise located within the channels, extending between aligned electrically connection sites on the side of the stacked configuration.

Again, compression elements may be employed to enhance electrical connections between conductive particles, respective cores and respective channels. The compression element may comprise a suitably-backed printed circuit board supporting conductors pressed against corresponding ones of the connection elements, a printed circuit board including electrically conductive via holes pressed against corresponding ones of the connection elements, or another stack of interconnected electronic modules.

In accordance with another aspect of the invention, the elongated electrically conductive core of each connection element comprises a hollow tube structure which can be internally pressurized to expand the tube structure and compress the layers of elastomeric material. Adjacent stacks of modules are assembled, and the connection elements with hollow tube structures are inserted loosely into the channels. When pressurized, the tube structures expand, compressing the elastomeric material to form electrical connections. This form is particularly useful when the channels are not in perfect initial alignment, as a custom-configured connection is accordingly formed. In other variations, cooling liquid is conducted through the hollow tube structures, or a material is injected in liquid form under pressure to expand the hollow tube structures, and subsequently solidified to maintain the hollow tube structures in their expanded configuration.

In another embodiment, the connection element is used to provide an electrical interconnection between a channel in the upper major surface of one circuit module in a stack and a corresponding channel in the lower major surface of the circuit module immediately above in the stack, the channels being lined with respective electrically conductive layers. The modules are pressed together with the connection element engaging the channels to electrically connect the electrically conductive layers. The channels need not be straight. In one embodiment the channels are circular and the connection element is configured as ring to define a coaxial RF shielding structure.

In accordance with yet another aspect of the invention, a method is provided for forming an electrical interconnection to circuitry supported by an electrically insulating circuit substrate having a pair of opposed major surfaces and a side surface. The method includes the steps of forming a channel in the substrate side surface lined with an electrically conductive layer electrically connected to the circuitry, providing a connection element as summarized hereinabove, and inserting at least a portion of the connection element into the channel. As a variation in the method, another electrically insulating circuit substrate supporting circuitry, having a pair of opposed major surfaces and a side surface, and having a channel formed in the side surface between the major surfaces and lined with and electrically conductive layer electrically connected to the circuitry is provided. The channel of the second electrically insulating circuit substrate is pressed against the connection element to establish an electrical connection.

In a related method for providing a three-dimensional stack of modules or substrates, a plurality of electrically insulating substrates are provided, each substrate having a pair of opposed major surfaces, a side surface, and at least one integrated circuit thereon.

Another step in the method is providing respective electrical connection sites on the side surface of each of the substrates by forming respective channels in the substrate side surfaces between the major surfaces, and lined with electrically conductive layers electrically connected to the respective integrated circuits. The substrates are stacked in a vertical configuration with the electrical connection site channels of the respective substrates in alignment. Next, connection elements are provided as described hereinabove, and inserted into the aligned connection site channels to establish electrical connections.

BRIEF DESCRIPTION OF THE DRAWINGS

While the novel features are set forth with particularity in the appended claims, the invention, both as to organization and content, will be better understood and appreciated, from the following detailed description taken in conjunction with the drawings, in which:

FIG. 1 is a longitudinal cross-sectional view of a connection element in accordance with the invention;

FIG. 2 is an end view taken on line 2—2 of FIG. 1;

DETAILED DESCRIPTION

Figure 3:
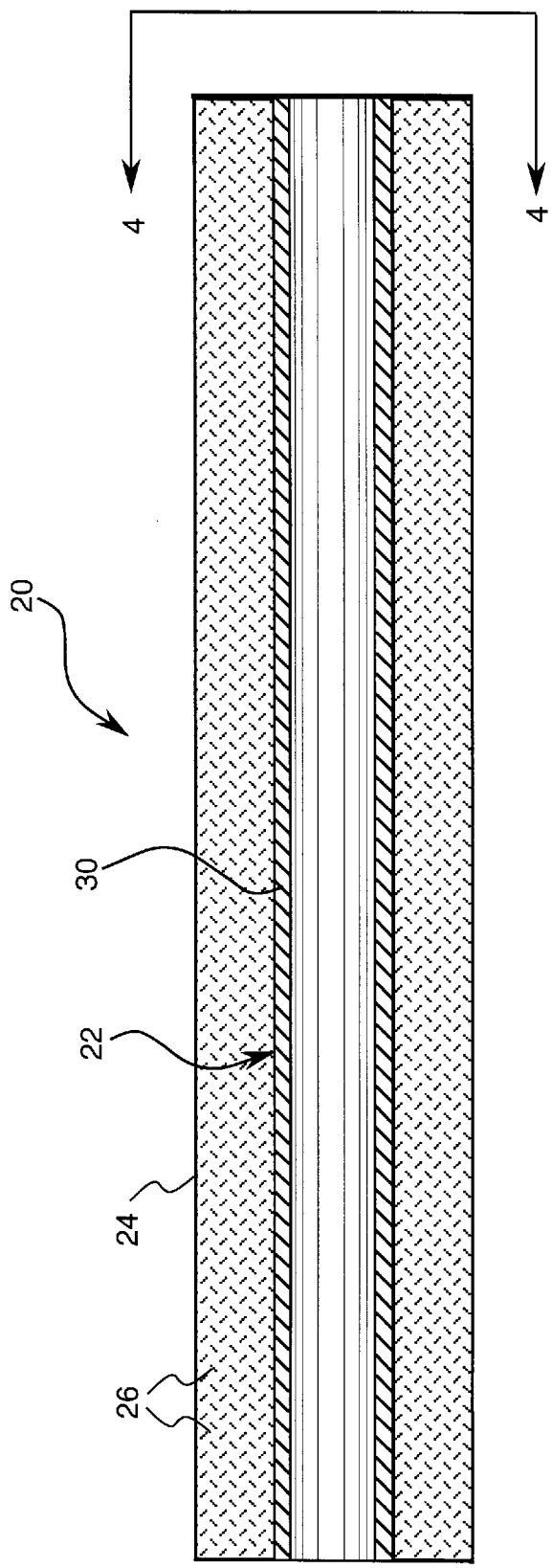
FIG. 3 is a similar longitudinal cross-sectional view of an alternative connection element in accordance with the invention, wherein the wire comprises a hollow tube.

Referring first to FIGS. 1 and 2, a connection element 20 has an elongated electrically conductive core 22 coated with a layer of elastomeric material 24 containing conductive particles 26. In its simplest form, elongated electrically conductive core 22 is a solid wire. However, core 22 may take a variety of forms, including various hollow tube structures, described hereinbelow with reference to FIGS. 3–5, 13 and 14.

Core 22 is made of a material which is a good conductor of electricity, and preferably of a material which does not oxidize. Core 22 may be solid, plated, hollow or segmented. Suitable materials are gold, molybdenum, tungsten and nickel wire that is gold electroplated. Employing a core 22 which is a good conductor results in a constant impedance at each electrical connection interface, as is described hereinbelow. Core 22 typically ranges in diameter from 0.5 mil to several hundred mils.

Conductive elastomer layer 24 more particularly comprises an elastomer such as silicone, polyurethane, or a high temperature and low durometer material such as DuPont Kapton, or Kalrez., capable of withstanding temperatures up to 310° C. Layer 24 is typically 1 to 10 mils in thickness. Particles 26, which actually provide the electrical conductivity, are of a suitable material, such as silver, and layer 24 becomes conductive when compressed approximately 20%.

Alternatively, elastomer layer 24 may be filled with conductive particles 26 to the point where layer 24 is conductive even in an uncompressed state. Connection elements 22 with such highly-filled conductive elastomer layers 24 are advantageously employed in interconnect structures configured such that unintentional shorting cannot occur.

To make connection element 20, wire or other core 22 material of appropriate size, shape, surface finish and length is coated in a manner similar to that of motor wire varnish application technology. In particular, wire is passed through dies (or wiper blades if the wire has a rectangular cross-section), with a suitable elastomeric material containing conductive particles. The elastomeric material is then baked and/or cured in place. Alternatively, and particularly for making connection elements 20 in relatively larger sizes, wire or other core 22 material is suspended in a mold. Elastomeric material 24 containing conductive particles 26 is then injected into the mold around core, and then solidified. Extrusion of the elastomeric material over the connection elements on a continuous basis is also possible where the connection elements and coatings are of relatively larger sizes.

Figure 4:
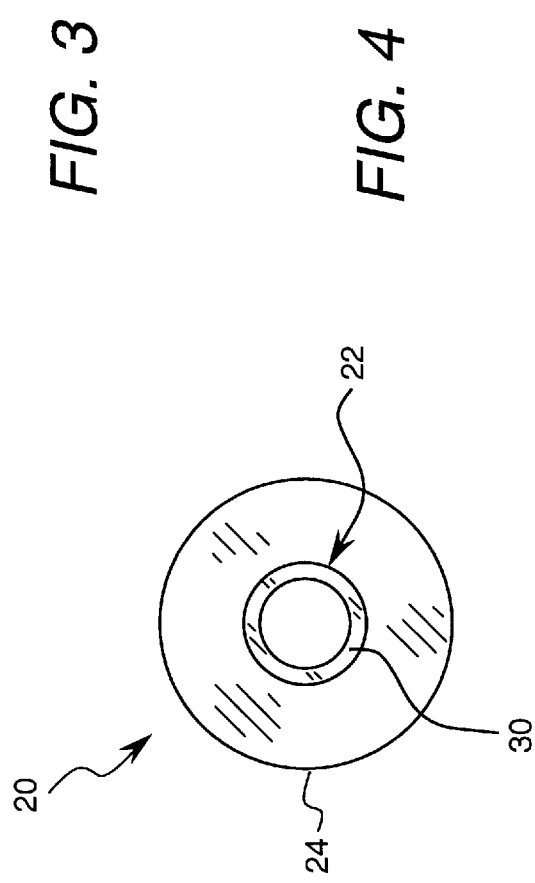
FIG. 4 is an end view taken on line 4—4 of FIG. 3.

FIGS. 3 and 4 illustrate a variation, the use of which is described hereinbelow in greater detail with reference to FIGS. 13 and 14, wherein electrically conductive core 22 comprises a hollow tube structure 30 in its simplest form, in particular, an actual hollow tube 30. Hollow tube structure 30 may be internally pressurized, thereby expanding hollow tube structure 30 to compress elastomeric material layer 24.

Figure 5:
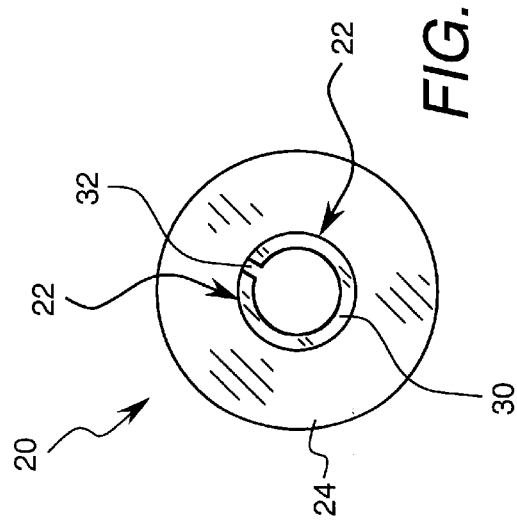
FIG. 5 is an end view similar to that of FIG. 4, showing a modification where the hollow tube is longitudinally split to make expansion of the hollow tube easier.

With reference to FIG. 5, to make such expansion easier, an alternative hollow tube structure 31 includes at least one longitudinal split 32. Elastomeric material layer 24 sealingly bridges across gap or split 32 so that hollow tube 30 can maintain internal pressure as in the un-split FIG. 4 form. Single or multiple splits 32 can be used, in various geometrical arrangements, including multiple discontinues splits extending along tube 31 in a circumferentially staggered configuration.

Figure 6:
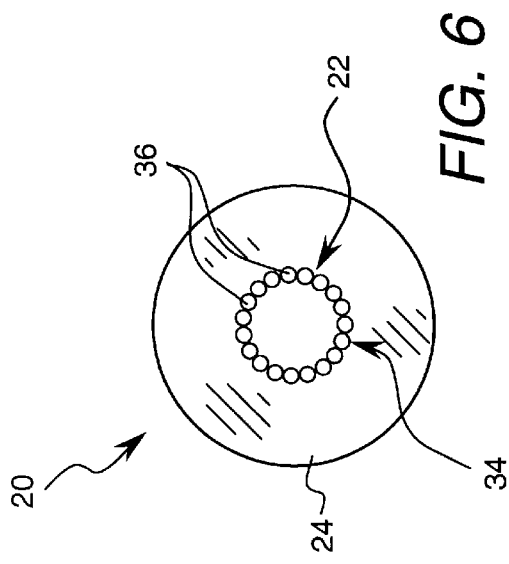
FIG. 6 is an end view similar to that of FIG. 4, showing another modification in the form of a cage-like structure made of individual longitudinally extending wires.

FIG. 6 illustrates connection element 20 with yet another form of hollow tube structure 34 which can be more easily expanded when internal pressure is applied. In FIG. 6, electrically conductive core 22 takes the form of a cage-like structure 34 made of individual longitudinally extending wires 36 defining circumferentially-split segments of core 22. To make the FIG. 6 connection element 20, individual wires 36 are placed on the outside of a cylindrical form (not shown), elastomeric material layer 24 is applied and cured, and the form is removed.

Figure 7:
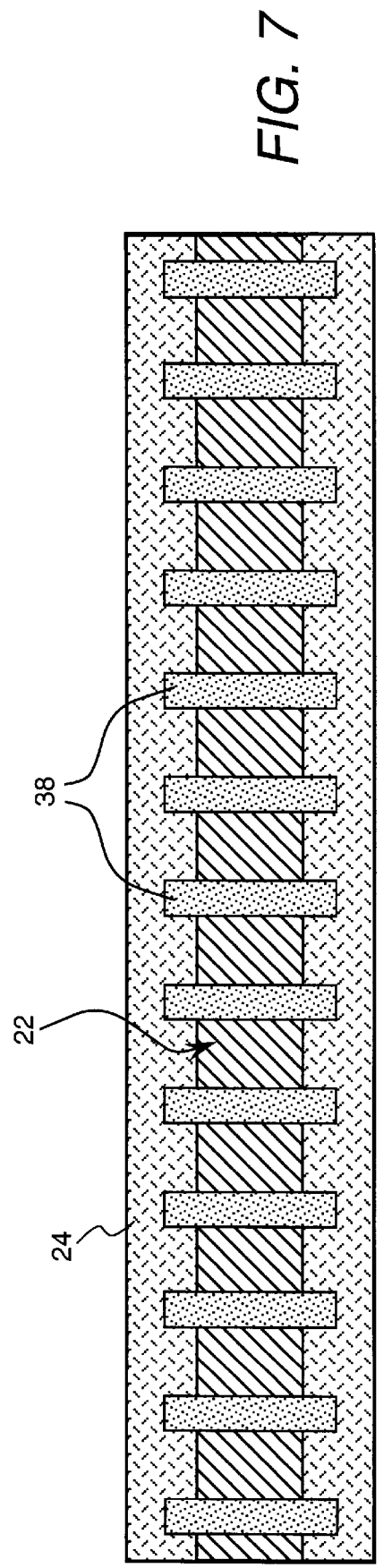
FIG. 7 is a longitudinal cross-sectional view of an alternative embodiment of a connection element, including a radially-extending structure for increased localized compression of the elastomeric layer.

FIG. 7 depicts another variation wherein core 22 has a radially-extending electrically conductive structure, in the representative form of disks 38, which result in increased localized compression of elastomeric layer 24 when connection element 20 is compressed. As noted above, typically a compression of approximately 20% is required to achieve connection. Disks 38 are representative only, as a variety of radially-extending structures may be provided, such as structures produced by crimps and indents.

Figure 8:
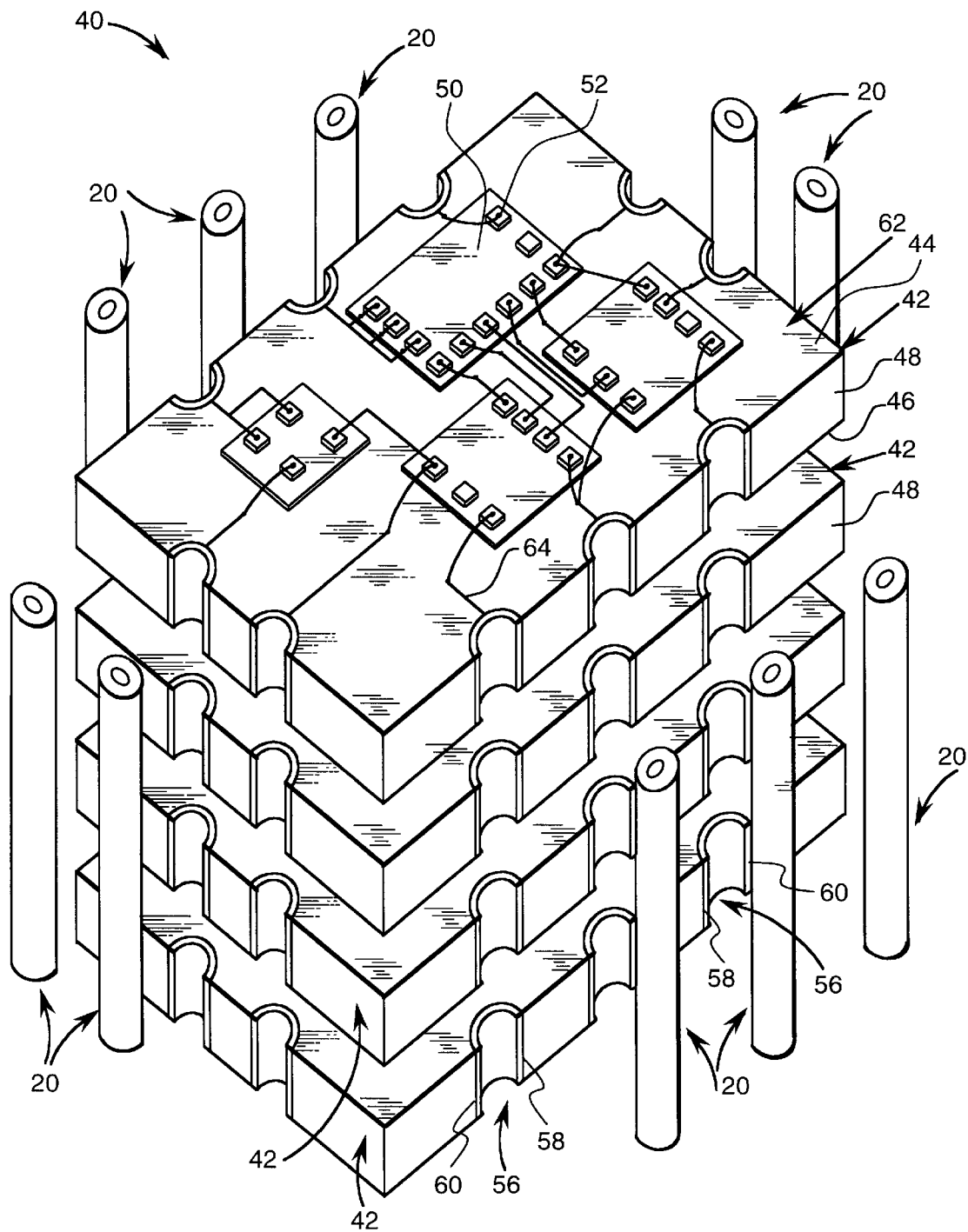
FIG. 8 is an exploded three-dimensional view of a stack of electronic modules interconnected employing connection elements.

FIG. 8 is an exploded representation of a stack 40 of multi-chip modules (MCMs) 42 interconnected employing connection elements 20 as are described hereinabove. FIG. 8 is highly schematic, as connection elements 20 in practice are smaller and much more closely spaced, for example, 2 mils in diameter and spaced 2 mils apart.

Each individual substrate or multi-chip module 42 is fabricated generally as described in the above-referenced Eichelberger et al U.S. Pat. No. 4,783,695, and related patents, and has upper and lower opposed major surfaces 44 and 46, and edge surfaces 48. Circuitry in the representative form of integrated circuit "chips" 50 is supported on substrates 42, the integrated circuits 50 including individual connection pads 52. As other examples, micro electromechanical structures (MEMS), including piezoelectric devices may be supported on substrates 42 and electrically connected.

Modules 42 can be fabricated of ceramics, plastics or composites of various types which are compatible thermally, chemically and mechanically with the processing of the interconnects.

Electrical connection sites, generally designated 56, are provided on side surfaces 48. Thus module 42 substrates may be viewed as interconnect supports for connection sites 56. More particularly, electrical connection sites 56 take the form of channels 58 formed in side surfaces 48 extending between major surfaces 44 and 46, each lined with an electrically conductive layer 60, such as conventional metallization. Although channels 58 are illustrated as being semi-circular in cross-section, it will be appreciated that a variety of cross-sectional shapes may be employed, such as V-channels or rectangular channels, as examples.

Slots or channels 58 can be as small as 2 mils in width, with a spacing of 2 mils. They may be cut with a wafer saw blade, or they can be formed by cutting through the diameter of pre-made holes drilled through the faces of the substrates, which are then cut on a line running through the centers of the holes. Other fabrication techniques which may be employed include those used to make micro electromechanical structures (MEMS), and laser machining. The selection of channel 58 size, core 22 size and elastomeric layer 24 thickness depend on the spacing available between the connection sites 56 on the modules, or other electronic assemblies.

To provide electrical connections between pads 52 of individual integrated circuits, and between pads 52 and electrical connection sites 56, a multi-layer high density interconnect overcoat structure, generally designated 62, is formed as is briefly summarized hereinabove, and described in greater detail in the above-identified Eichelberger et al U.S. Pat. Nos. 4,783,695, 5,019,946, and 5,107,586. Included within laminated overcoat structure 62 are representative connections 64 to the metallization of individual electrical connection sites 56 on side surfaces 48.

An alternative construction (not illustrated) can provide a module stack of much lighter weight for weight-sensitive applications. In this alternative construction, module substrates 42 support various integrated circuit "chips" and other components, and there is a separate frame which is the thickness of the thickest component and which has electrical connection sites 56 comprising channels 58 lined with electrically conductive layers 60. High density interconnect overcoat structure 62 is attached to the components, substrates 42 and frame, and provides electrical connections to sites 56. In this alternative construction, the frame serves as the interconnect support for connection sites 56.

In either event, connection elements 20 as described hereinabove with reference to FIGS. 1–7 are inserted within connection site 56 channels 58 and compressed as needed to achieve electrical connection. Typically 20% compression is required. However, much less compression is required when elastomer layer 24 is filled with conductive particles 26 to the point where layer 24 is conductive even in an uncompressed state. Compression may be provided by the fit of connection elements 20 within channels 58, by a separate compression or clamping element 70 and 72 as described hereinbelow with reference to FIGS. 9 and 10, or by expanding a hollow tube structure core 22, such as the cores 30, 31 and 34 illustrated in FIGS. 3–6. The relaxation characteristic of elastomer 24 and expansion against channel 58 metallization 60 may, in itself, be sufficient to form an adequate contact.

When so located and compressed, constant and relatively low impedance electrical connections are established between metallization 60, conductive particles 24 and cores 22.

Figure 9:
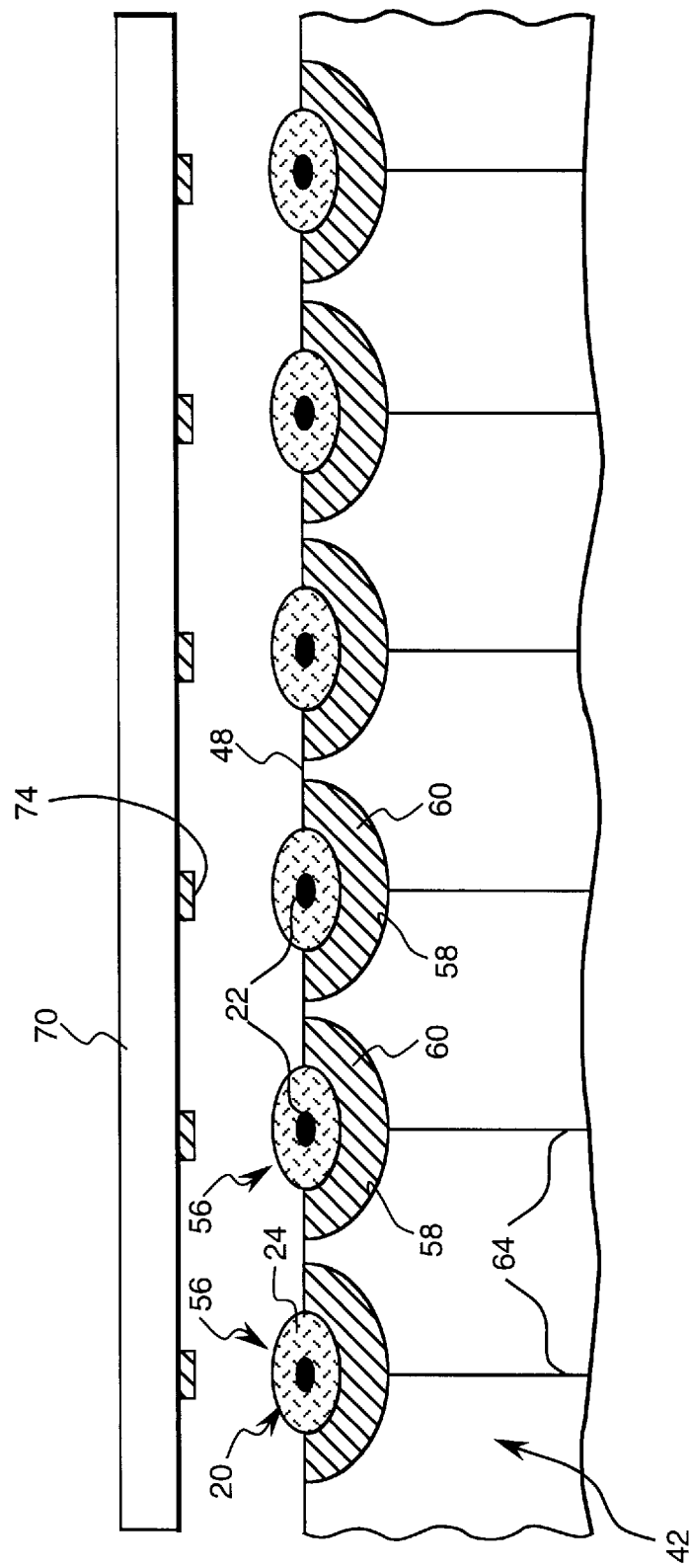
FIG. 9 is a representative top view of the edge of the circuit substrate, with a representative compression element in the form of a printed circuit board supporting conductors.
Figure 10:
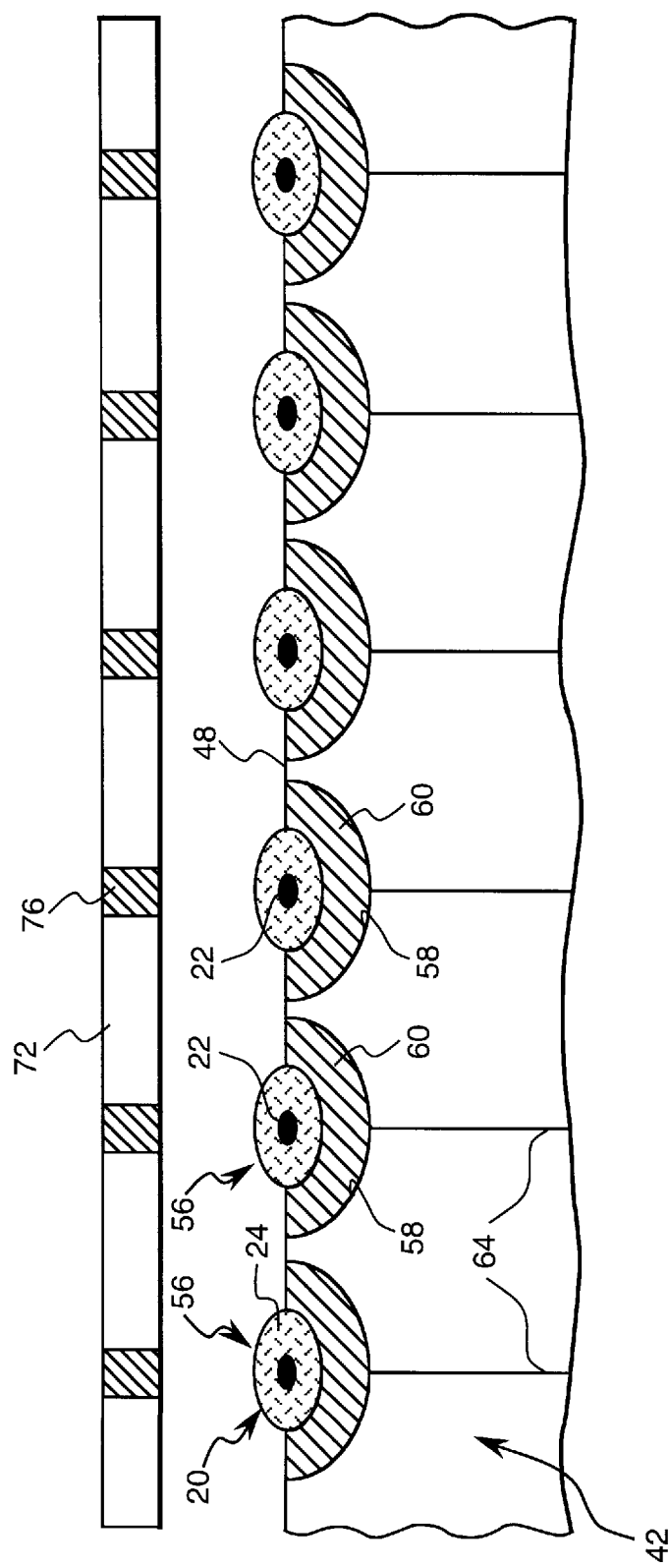
FIG. 10 is a similar representative top view of a compression element in the form of a printed circuit board including electrically conductive via holes.

Preferably, and as illustrated in FIGS. 9 and 10, for improved contact, compression or clamping element 70 or 72, typically including matching interconnect structure 74 or 76, is forced against elastomeric layer 24 of connection elements 20. In addition to improving the contact, external electrical connections are facilitated. In FIG. 9 compression element 70 takes the form of a printed circuit board supporting conductors 74, and in FIG. 10 compression element 72 takes the form of a printed circuit board supporting vias 76, in both cases aligned with connection sites 56. Although not illustrated in FIGS. 9 and 10, it will be appreciated that ordinary printed circuit board materials generally lack sufficient strength and rigidity, and a structural backing element (not shown) is typically employed.

The clamping elements of FIGS. 9 and 10, pressed against connection elements 20, result in selective connections that maintain integrity even when subjected to vibration and shock. Such allows for a mechanically sound design, which is not subject to many of the conventional design considerations of alignment and pressure to maintain connection and reliability.

The compliant nature of elastomeric material 24 further accommodates movement caused by differences in the coefficient of thermal expansion of the various materials employed, achieving reliable connections which are sufficiently compliant to avoid breaking in the manner of soldered joints when subject to thermal expansion and contraction.

Since the bulk of connection elements 20 is metal of high conductivity, conductive elastomer layer 24, which can be relatively thin, increases the line resistance only slightly, since the distances between the major conductor metals 22 and 60 of the contact are very short, and of constant thickness, and are amortized by the nature of the connection elements 20, with their radial design.

Moreover, defects in conductive elastomeric layer 24 can be tolerated, since a relatively large area is available for contact.

Figure 11:
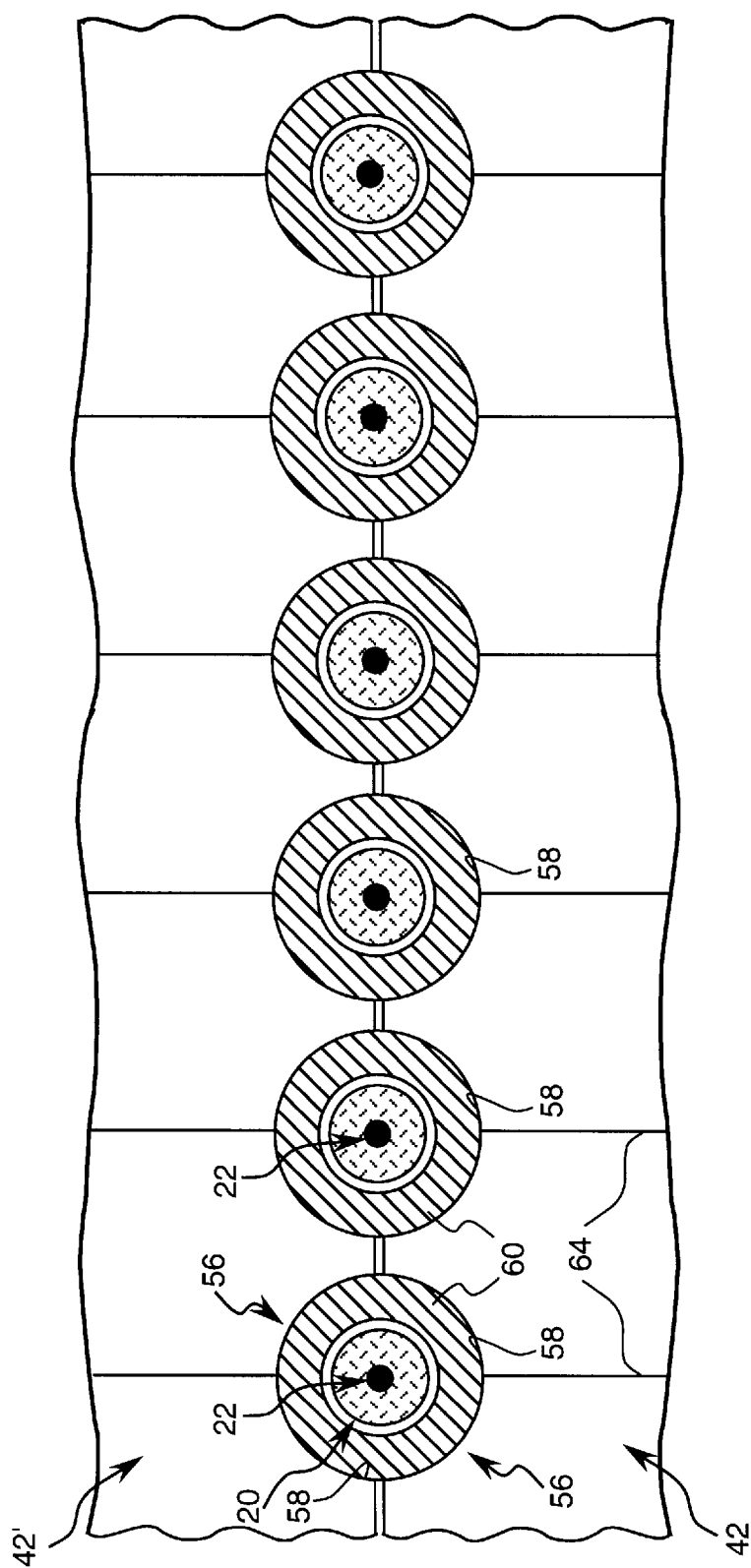
FIG. 11 is a top view wherein the compression element comprising another circuit substrate.

FIG. 11 illustrates an embodiment where two substrates 42 and 42', each with connection sites 56 in the form of channels 58 are placed side by side, and pushed against each other, so that each substrate may be viewed as the compression element of the other. Each of the substrates 42 and 42' in FIG. 9 may be one of a stack in a three-dimensional structure, or two substrates may be placed side-by-side in a two-dimensional structure. In either event, misalignment is accommodated.

Figure 12:
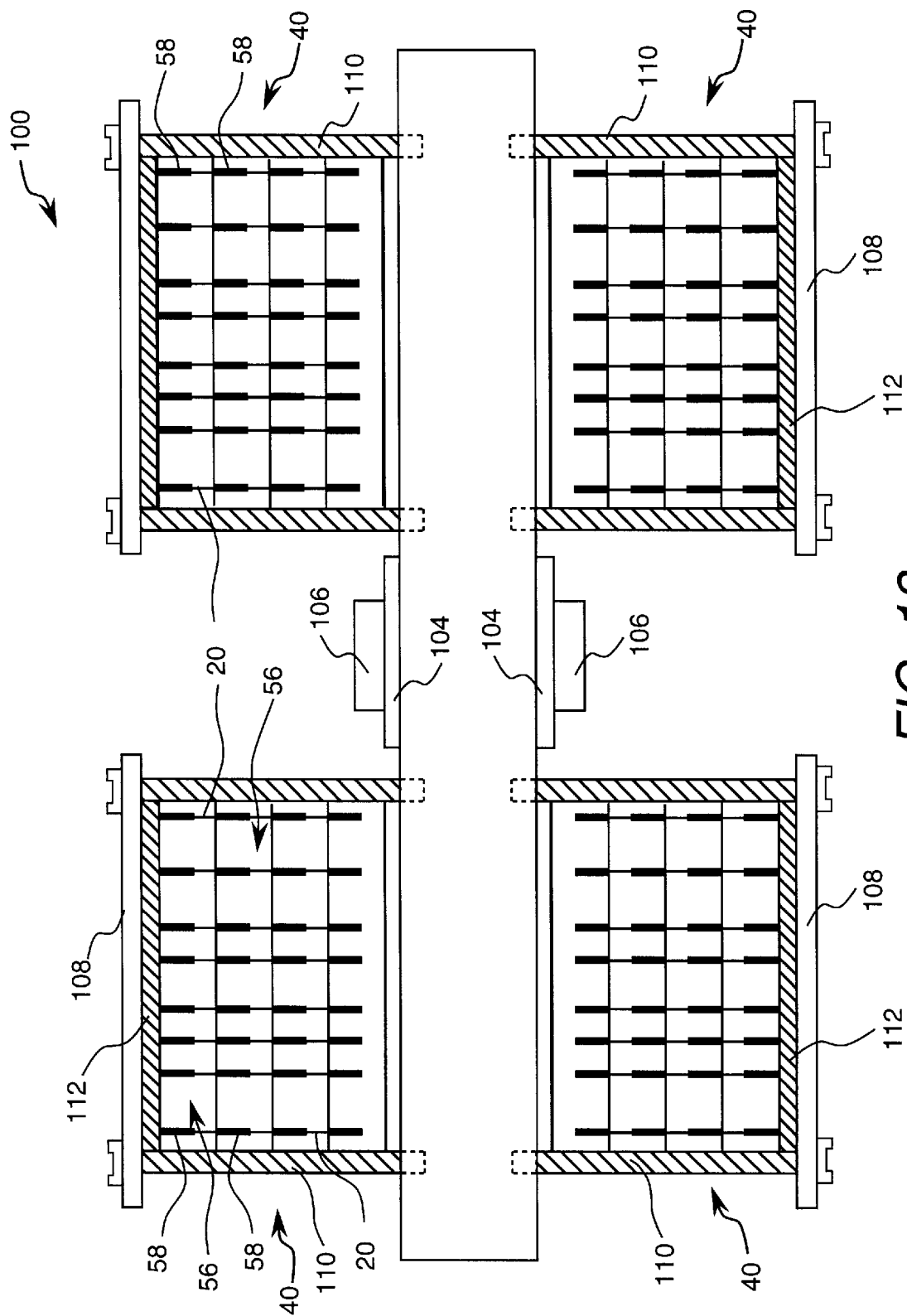
FIG. 12 is a highly schematic representation of an assembly including four stacks of multi-chip modules interconnected and mounted to a liquid cooled printed circuit board assembly.

FIG. 12 depicts a more comprehensive assembly 100, including four stacks 40 like the single stack 40 of FIG. 6. In FIG. 12, stacks 40 are mounted to a liquid cooled board assembly 102, supporting representative printed circuit boards 104 and representative circuit elements such as FIFO memory elements 106.

Stacks 40 are secured to board 102 by means of respective thermal pressure plates 108 secured by means of bolts 110, with a gasket 112 between pressure plate 108 and the top module or substrate of each stack. Gasket 112 may comprise a liquid cooled inflatable structure which both cools the assembly and applies pressure.

In FIG. 12, as in FIG. 8, schematically-depicted channels 58 are formed at connection sites 56 in side surfaces 48 of modules 42, and connection elements 20 are retained in and extend between channels 58. In FIG. 12, channels 58 are configured so that connection elements 20 can "snap" in and be retained, under sufficient compression, without requiring a separate clamping element. FIG. 12 is also an example of a structure wherein elastomer layer 24 may be filled with conductive particles 26 to the point where layer 24 is conductive even in an uncompressed state. There is no opportunity for unintentional shorting.

Figure 13:
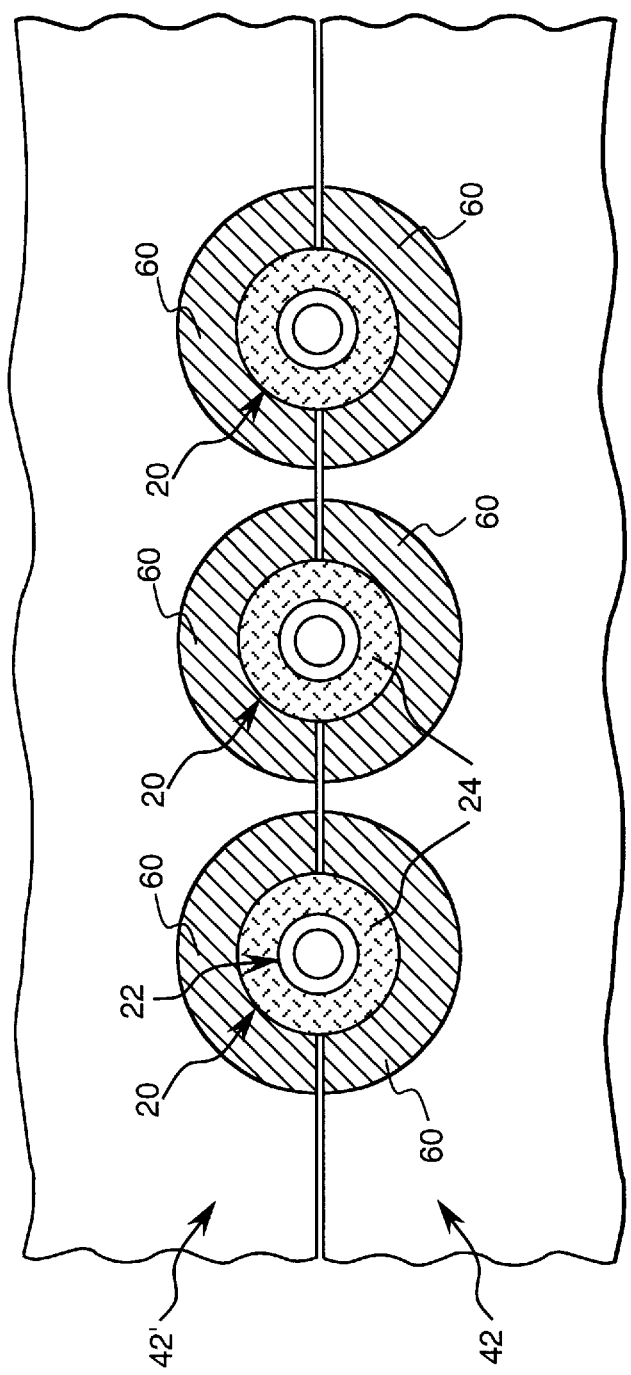
FIG. 13 is a representative top view depicting use of the connection element of FIGS. 3 and 4 which include a hollow tube.

FIG. 13 depicts an embodiment employing a connection element 20 having a core 22 comprising a hollow tube structure 30, such as one of the structures of FIGS. 3 and 4, FIG. 5, or FIG. 6. Internal pressure can be applied to swell tube structure 30, compressing elastomer layer 24 for better contact with metallization 60, without requiring a clamping element. In addition, cooling liquid under pressure can be circulated through hollow tube structures 30.

In FIG. 13, as in FIG. 11, a pair of substrates or modules 42 and 42', preferably each part of a stack 40, are assembled edge to edge. Connection elements 20 are loosely inserted into the hollow channels thus defined, and tube structures 30 are internally pressurized, for example with cooling liquid, sufficiently swelling cores 22 to compress elastomeric layer 24 to achieve the electrical connections. This technique is particularly suitable for testing purposes, where ease of connection is possible. It will be appreciated that alignment between the slot channels of adjacent substrates is not critical.

Figure 14:
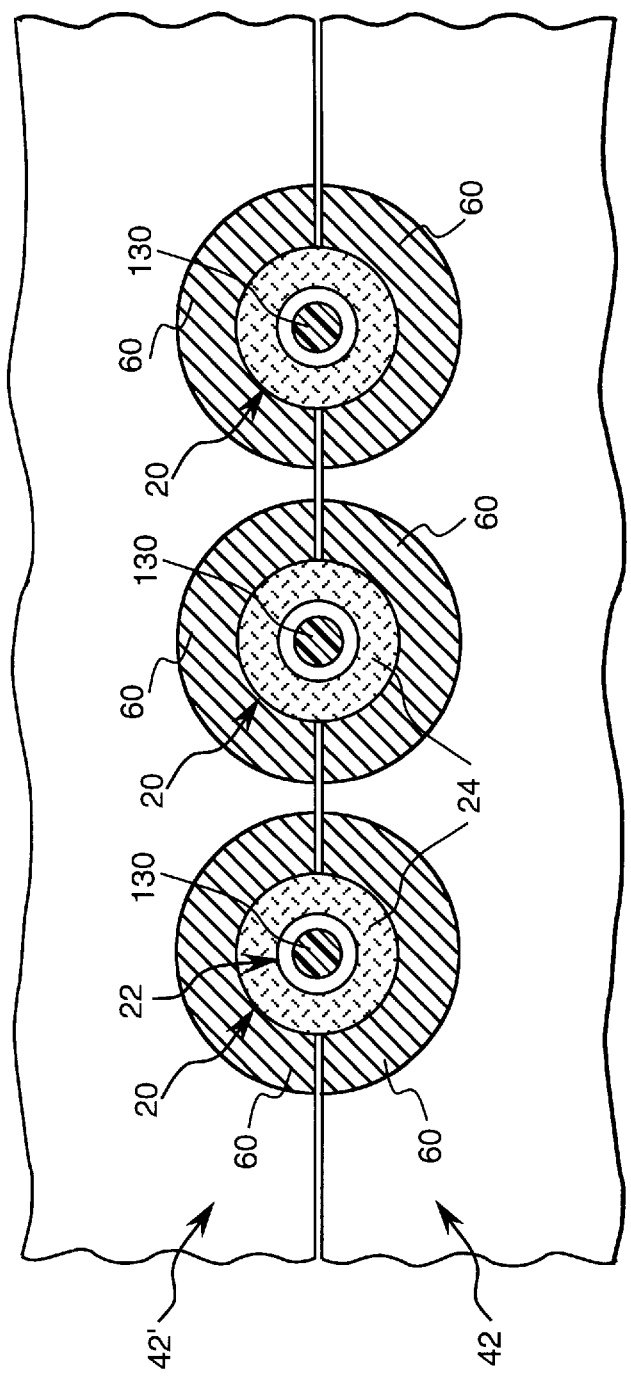
FIG. 14 is a similar view, wherein the hollow tube is internally pressurized with cured injected expanded foam.

FIG. 14 depicts a variation in which a polymer 130 other material is injected in liquid form under pressure into hollow tube structures 30, again expanding cores 22 so as to compress conductive elastomer layers 24. Material 130 subsequently solidifies to maintain the pressurized configuration for a permanent interconnect. The interconnect is particularly tolerant of alignment mismatches, and is in effect customized for each particular assembly.

Figure 15:
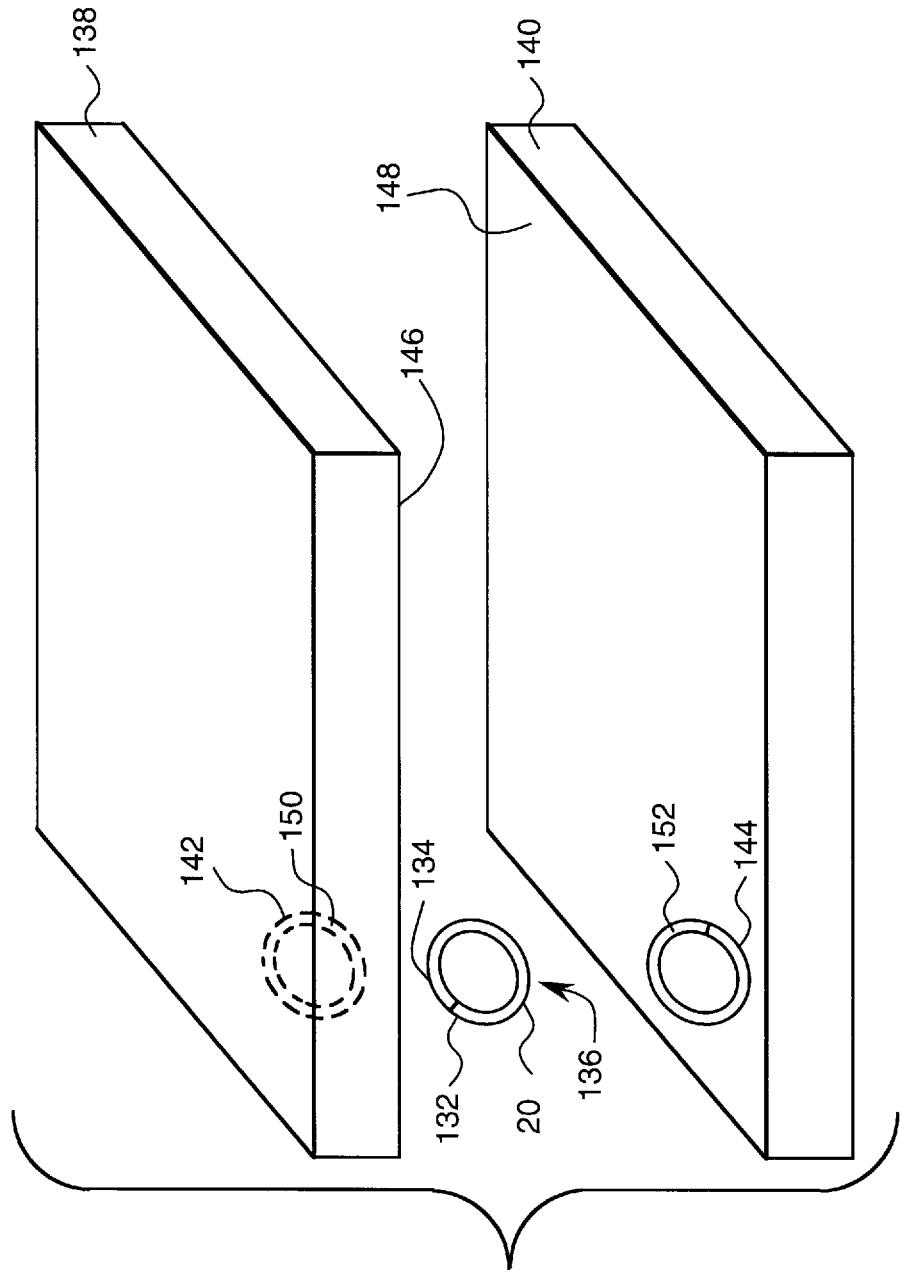
FIG. 15 is an exploded view depicting a coaxial RF shield connection between circuit modules.

Referring finally to FIG. 15, channel 58 need not be straight. Zig-zag, circular, or other shapes may be employed, such as for RF shielding. Also, channel 58 need not be on side surface 48. Connection element 20 may be used to make an electrical connection between connection sites on the bottom surface of one module in a stack and the top surface of the module below.

In particular, FIG. 15 is an exploded view depicting an embodiment where connection element 20 has its two ends 132 and 134 adjacent to form a ring-like connection device 136.

MCM substrates 138 and 140 have respective circular channels 142 and 144 formed in their bottom and top major surfaces 146 and 148, respectively, and lined with electrically conductive layers 150 and 152, respectively. When substrates 138 and 140 are pressed together with device 136 engaging both channels 142 and 144, device 136 is compressed to provide an electrical connection between layers 150 and 152. In the particular ring configuration illustrated, connection device 136 forms a coaxial shield about a center conductor (not shown).

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. An electrical interconnection comprising:
   an electrically insulating interconnect support having a pair of opposed major surfaces and a side surface;
   an electrical connection site comprising a channel formed in said side surface and lined with an electrically conductive layer electrically connected to circuitry; and
   a connection element comprising an elongated electrically conductive core coated with a layer of elastomeric material containing conductive particles, at least a portion of said connection element being located within said channel;
   a compression element pressed against said connection element to enhance electrical connection between said conductive particles, said core and said channel, said compression element comprising a printed circuit board supporting a conductor pressed against said connection element to establish an electrical connection with said circuit board conductor.

2. An electrical interconnection comprising:
   an electrically insulating interconnect support having a pair of opposed major surfaces and a side surface;
   an electrical connection site comprising a channel formed in said side surface and lined with an electrically conductive layer electrically connected to circuitry; and
   a connection element comprising an elongated electrically conductive core coated with a layer of elastomeric material containing conductive particles, at least a portion of said connection element being located within said channel;
   a compression element pressed against said connection element to enhance electrical connection between said conductive particles, said core and said channel, said compression element comprising a printed circuit board including an electrically conductive via hole pressed against said connection element to establish an electrical connection with said via hole.

3. An electrical interconnection comprising:
   an electrically insulating interconnect sup port having a pair of opposed major surfaces and a side surface, said interconnect support comprising a circuit substrate supporting circuitry;
   an electrical connection site comprising a channel formed in said side surface and lined with an electrically conductive layer electrically connected to the circuitry; and
   a connection element comprising an elongated electrically conductive core coated with a layer of elastomeric material containing conductive particles, at least a portion of said connection element being located within said channel;
   a compression element pressed against said connection element to enhance electrical connection between said conductive particles, said core and said channel;
   said compression element comprising another electrically insulating circuit substrate having a pair of opposed major surfaces and a side surface, with a channel formed in said side surface and lined with an electrically conductive layer electrically connected to circuitry supported by said another substrate, said channel of said another substrate being pressed against said connection element to establish an electrical connection.

4. The electrical interconnection of claim 3, wherein said core comprises a hollow tube structure internally pressurized to expand said tube structure and compress said layer of elastomeric material.

5. The electrical interconnection of claim 4, wherein said hollow tube structure is internally pressurized with a material injected in liquid form under pressure to expand said hollow tube structure to an expanded configuration and subsequently solidified to maintain said hollow tube structure in the expanded configuration.

6. A connection element comprising an elongated electrically conductive core coated with a layer of elastomeric material containing conductive particles, said core comprising a hollow tube structure which can be internally pressurized to expand said tube structure.

7. The connection element of claim 6, wherein said hollow tube structure is internally pressurized with a material injected in liquid form under pressure to expand said hollow tube structure to an expanded configuration and subsequently solidified to maintain said hollow tube structure in the expanded configuration.

8. The connection element of claim 6, wherein the hollow tube structure includes at least one longitudinal split.

9. The connection element of claim 6, wherein the hollow tube structure comprises a plurality of individual longitudinally extending wires.

10. A connection element comprising an elongated electrically conductive core coated with a layer of elastomeric material containing conductive particles and a radially-extending electrically conductive structure on said core for increased localized compression of said layer of elastomeric material when said layer of elastomeric material is compressed.

11. A stack comprising:
    a plurality of electronic modules in a stacked configuration, each module including a respective interconnect support having a pair of opposed major surfaces and a side surface, and each of said modules including circuitry;
    electrical connection sites on the side surface of each of said interconnect supports comprising aligned electrical connection sites on a side of said stacked configuration of said plurality of modules, said electrical connection sites on each of said interconnect supports, respectively, comprising a channel formed in the respective side surface extending between said opposed major surface of a respective interconnect supports lined with an electrically conductive layer electrically connected to said circuitry included in each of said modules, respectively; and
    a plurality of connection elements, each comprising an elongated electrically conductive core coated with a layer of elastomeric material containing conductive particles, located within said channels and extending between aligned electrical connection sites on said side of said stacked configuration to interconnect said modules.

12. The stack of claim 11, wherein each of said interconnect supports comprises a circuit substrate, and said circuitry is supported by respective substrates.

13. The stack of claim 11, wherein said circuitry comprises at least one integrated circuit.

14. The stack of claim 11, further comprising a compression element pressed against said connection elements to enhance electrical connections between conductive particles, respective cores, and respective channels.

15. The stack of claim 14, wherein said compression element comprises a printed circuit board supporting conductors pressed against corresponding ones of said connection elements.

16. The stack of claim 14, wherein said compression element comprises a printed circuit board including electrically conductive via holes pressed against corresponding ones of said connection elements.

17. The stack of claim 12, further comprising a compression element pressed against said connection elements to enhance electrical connections between conductive particles, respective cores, and respective channels, and wherein said compression element comprises another stack of interconnected electronic modules including:
   a plurality of electrically insulating substrates in another stacked configuration, each substrate having a pair of opposed major surfaces and a side surface, and each of said substrates supporting circuitry; and
   electrical connection sites on the side surface of each of said substrates comprising aligned electrical connection sites on a side of said another stacked configuration of said plurality of substrates, said electrical connection sites on each of said substrates, respectively, comprising a channel formed in the respective side surface extending between said opposed major surface of a respective substrate and lined with an electrically conductive layer electrically connected to said at least one integrated circuit supported by each of said substrates, respectively;
   said electrical connection site channels of said another stacked configuration being pressed against said connection elements to establish electrical connections.

18. The stack of claim 17, wherein said cores comprise hollow tube structures internally pressurized to expand said tubes and compress said layers of elastomeric material of respective connection elements.

19. An electrical interconnection comprising:
   a pair of electrically insulating circuit modules each having upper and lower opposed major surfaces;
   a channel formed in the upper surface of one of said modules and lined with an electrically conductive layer, and a corresponding channel formed in the lower surface of the other of said modules and lined with another electrically conductive layer; and
   a connection element comprising an elongated electrically conductive core coated with a layer of elastomeric material containing conductive particles;
   said circuit modules begin pressed together with said connection element engaging said channels to electrically connect said electrically conductive layers.

20. The electrical interconnection of claim 19, wherein said channels are circular.

21. A method for forming an electrical interconnection, said method comprising:
   providing an electrically insulating circuit substrate having a pair of opposed major surfaces and a side surface;
   forming a channel in the substrate side surface between the major surfaces;
   lining the channel with an electrically conductive layer;
   providing circuitry on one surface of the major surfaces, wherein lining the channel and providing circuitry include electrically connecting the channel and the circuitry;
   providing a connection element including an elongated electrically conductive core coated with a layer of elastomeric material containing conductive particles; and
   inserting at least a portion of the connection element into the channel; and
   pressing a printed circuit board supporting a conductor against said connection element to establish an electrical connection with said circuit board conductor.

22. A method for forming an electrical interconnection, said method comprising:
   providing an electrically insulating circuit substrate having a pair of opposed major surfaces and a side surface;
   forming a channel in the substrate side surface between the major surfaces;
   lining the channel with an electrically conductive layer;
   providing circuitry on one surface of the major surfaces, wherein lining the channel and providing circuitry include electrically connecting the channel and the circuitry;
   providing a connection element including an elongated electrically conductive core coated with a layer of elastomeric material containing conductive particles; and inserting at least a portion of the connection element into the channel; and
   pressing a printed circuit board including an electrically conductive via hole against the connection element to establish an electrical connection with the via hole.

23. A method for forming an electrical interconnection, said method comprising:
   providing an electrically insulating circuit substrate having a pair of opposed major surfaces and a side surface;
   forming a channel in the substrate side surface between the major surfaces;
   lining the channel with an electrically conductive layer;
   providing circuitry on one surface of the major surfaces, wherein lining the channel and; providing circuitry include electrically connecting the channel and the circuitry
   providing a connection element including an elongated electrically conductive core coated with a layer of elastomeric material containing conductive particles;
   inserting at least a portion of the connection element into the channel; and
   providing another electrically insulting circuit substrate supporting circuitry, having a pair of opposed major surfaces and a side surface, and having a channel formed in the side surface between the major surfaces and lined with an electrically conductive layer electrically connected to the circuitry; and
   pressing the channel of the another electrically insulating circuit substrate against the connection element to establish an electrical connection.

24. A method for interconnecting integrated circuits, comprising the steps of:
   providing a plurality of electrically insulating substrates, each respective substrate having a respective pair of opposed major surfaces, a respective side surface, and at least one respective integrated circuit thereon;
   providing respective electrical connection sites on the side surface of each of the substrates by forming respective channels in the substrate side surfaces between the major surfaces and lined with electrically conductive layers electrically connected to the respective integrated circuits;
   stacking the substrates in a vertical configuration with the electrical connection site channels of the respective substrates in alignment;
   providing a connection element including an elongated electrically conductive core coated with a layer of elastomeric material containing conductive particles; and inserting the connection element into the aligned connection site channels to establish electrical connections.

25. An electrical interconnection comprising:

an electrically insulating interconnect support having a pair of opposed major surfaces and a side surface;

an electrical connection site comprising a channel formed in said side surface and lined with an electrically conductive layer electrically connected to circuitry; and a connection element comprising an elongated electrically conductive core coated with a layer of elastomeric material containing conductive particles, at least a portion of said connection element being located within said channel, the connection element being adapted to provide a constant impedance connection to the electrically conductive layer.

\* \* \* \* \*